(12) United States Patent
Rodi et al.

(10) Patent No.: US 7,093,240 B1
(45) Date of Patent: Aug. 15, 2006

(54) EFFICIENT TIMING CHART CREATION AND MANIPULATION

(75) Inventors: Eugene A. Rodi, Minneapolis, MN (US); Robert M. Rice, Buffalo, MN (US)

(73) Assignee: Unisys Corporation, Blue Bell, PA (US)

( * ) Notice: Subject to any disclaimer, the term of this patent is extended or adjusted under 35 U.S.C. 154(b) by 459 days.

(21) Appl. No.: 10/028,152

(22) Filed: Dec. 20, 2001

(51) Int. Cl.
G06F 9/45 (2006.01)
G06F 17/50 (2006.01)
G06F 15/00 (2006.01)
F06F 19/00 (2006.01)

(52) U.S. Cl. .......................... 717/139; 716/6; 715/500; 702/125

(58) Field of Classification Search ........ 717/114–116, 717/142; 715/500–503; 707/1, 10; 713/500–503; 702/125; 716/6
See application file for complete search history.

(56) References Cited

U.S. PATENT DOCUMENTS

| | | | | |
|---|---|---|---|---|
| 5,033,009 A | * | 7/1991 | Dubnoff | ..................... 715/503 |
| 5,781,190 A | * | 7/1998 | Gorbet et al. | ................ 345/748 |
| 5,790,435 A | * | 8/1998 | Lewis et al. | .................... 716/6 |
| 5,983,181 A | * | 11/1999 | Yamazaki | .................... 704/260 |
| 6,108,661 A | * | 8/2000 | Caron et al. | ................ 707/102 |
| 6,115,759 A | * | 9/2000 | Sugimura et al. | ............. 710/52 |

OTHER PUBLICATIONS

Microsoft Corporation, Customizing Visio 2000 Software—White Paper, Published Apr. 1, 2000 http://www.microsoft.com/technet/prodtechnol/visio/visio2000/maintain/custom.mspx.*

* cited by examiner

*Primary Examiner*—Tuan Dam
*Assistant Examiner*—Chrystine Pham
(74) *Attorney, Agent, or Firm*—Beth L. McMahon; Charles A. Johnson; Mark T. Starr

(57) ABSTRACT

A program and method enables easy creation and manipulation of timing charts. The preferred embodiment employs off-the-shelf commercial software and uses Visual Basic commands to get timing chart drawing commands into the drawing program and out of the spreadsheet program to order the drawing program to produce a displayable and print/plotable file. The user can easily see changes needed and even if they require ripple-through redrawing, because the user manipulates data in the spreadsheet file instead of directly manipulating drawing commands, the spread sheet will carry through ripple-through calculations to modify all lines related to the recalculated data.

20 Claims, 12 Drawing Sheets

Add New Signals

Options

☑ Time  ☑ Bottom  ☐ Alt

Plot Color  ● Black  ○ Red  ○ Green  ○ Blue
○ Violet  ○ Cyan

[Add Option]

Signal Templates

Plot as: ● Scaler  ○ Min/Max  ○ Vector  ○ Repeat  ☐ Dotted  ☐ Glitch

Title | Initial Level [0] | Cycle Time of Repeat [ ] | Number of Repeats [ ] | Number of Transitions [2] | Glitch Type [1]

[Add Signal]

Infos

● ☐ Comment  ○ Arrows  ○ Begin Arrow  ○ End Arrow  ○ Open Arrow  ○ Close Box

Object Number [ ]  Time T1 [ ]  Time T2 [ ]  Text [ ]

[Add End]  [Add Marker]  At time [ ]  [Add Info]  [Exit]

← -AddNewSignals GUI
70

*Figure 7*

| options | +I | | -B | | | | | | |
|---|---|---|---|---|---|---|---|---|---|
| H | Test Timing Plot Data | | | | | | | | |
| Cycle | | 10 | | -10 | | | | | |
| options | -T | | | | | | | | |
| Rpt | Clock (Phase 1-4) | | | 10 | | | 10 ns | | |
| T | | 0 | | 0 | 0 | | | | |
| T | | 1.25 | | | | 1 | | | |
| T | | 2.5 | | | | 2 | | | |
| T | | 3.75 | | | | | | | |
| T | | 5 | | | | 3 | | | |
| T | | 6.25 | | | | | | | |
| T | | 7.5 | | | | 4 | | | |
| T | | 8.75 | | | | | | | |
| Options | +T | | | | | | | | |
| Mark | | | | | 10 | 12.5 | 15 | 17.5 | 20 |
| Label | All in cut | | | | | | | | |
| T | | 65 | C1 | | 75 | C2 | | | |
| T | | 85 | CC11 | | 95 | CC22 | | | |
| Label | T2 in cut | | | | | | | | |
| T | | 35 | C1 | | 75 | C2 | | | |
| Label | NONE in cut | | | | | | | | |
| T | | 35 | C1 | | 475 | | | | |
| Label | T1 in cut | | | | | | | | |
| T | | 65 | C1 | | 75 | C2 | | | |
| T | | 85 | | | 95 | | | | |
| T | | 111 | | | 470 | | | | |
| Label | First Signal | | | 1 | | | | | |
| T | | 10 | Cmt 1 too long to fit this space | | 20 | '<Cmt 2' | | | |
| T | | 35 | c2 | | 44.5 | | | | |
| T | | 55 | txt | | - | | | | |
| Glitch | | | | | | | | | |
| T | | 66.6 | last | | | | | | |

*Figure 8A*

| | | | | | |
|---|---|---|---|---|---|
| T | 475 | Done | | | |
| Info | | Show test #c cycles 30.2 to 66ns | 1 | 30.2 | 66.8 |
| Label | | Second Signal Text Line | | | |
| T | 25.5 | | | | |
| T | 125 | c1 | | | |
| T | 485 | | | <c2 | |
| Label | | Second Signal 1 Text Line | | | |
| T | 15.5 | | 1 | | |
| T | 25 | c1 | | | |
| T | 35 | | | c2 | |
| T | 45 | source of drop | | | |
| T | 450 | | | | |
| Info | | Test of the highlight area | 1 | 15.5 | 35 |
| Info | | Drop Arrows | | 1 | 55 | 475 |
| Info | | This is another test of text. | 1 | 2 | 21 |
| Label | | Second Signal 3 Text Line | | | |
| t | 15.5 | | 1 | | |
| t | 25 | c1 | | | |
| t | 35 | | | c2 | |
| Info | | CloseBox | 1 | | |
| Label | | Second Signal 4 Text Line | | | |
| t | 15.5 | | | | |
| Info | | Highlight the active region. | 9 | 5 | 457 |
| Info | | OpenBox | | | |
| t | 25 | c1 | | | |
| t | 35 | | | c2 | |
| Info | | Mark #T ns. third test of text | 1 | 80 | 488 |
| | | | 1 | | |
| Label | | Second Signal 5 Text Line | | | |
| T | 15.5 | | | | |

*Figure 8B*

| | | | | | | | c2 | | | |
|---|---|---|---|---|---|---|---|---|---|---|
| T | 25 | | | | | | | | | |
| T | 35 | | | | | | | | | |
| T | 460 | | | | | | | | | |
| T | 465 | | | | | | | | | |
| Info | test of drop arrows | EndArrow | | | 1 | | | | | |
| Info | Mark normal info comment line. | | | | | | | | | |
| | | | | | | | | | | |
| LV | Second Signal 7 Text Line | | 0 | | | | | | | |
| TV | 15.5 | L0 | | 0 | | | | | | |
| TV | 20 | L1 | | 1 | | | | | | |
| TV | 30 | L2 | | 2 | | | | | | |
| TV | 40 | L3 | | 3 | | | | | | |
| TV | 50 | L2 | | 2 | | | | | | |
| TV | 460 | L1 | | 1 | | | | | | |
| TV | 470 | L0 | | 0 | | | | | | |
| | | | | | | | | | | |
| Label v | Second Second Signal 7 Text Line | | 3 | | | | | | | |
| TV | 10 | L2 | | 2 | | | | | | |
| TV | 15 | L2 | | 2 | | | | | | |
| TV | 20 | L3 | | 3 | | | | | | |
| TV | 25 | L3 | | 3 | | | | | | |
| TV | 30 | L2 | | 2 | | | | | | |
| TV | 35 | L2 | | 2 | | | | | | |
| TV | 40 | L1 | | 1 | | | | | | |
| TV | 45 | L1 | | 1 | | | | | | |
| TV | 50 | L0 | | 0 | | | | | | |
| TV | 55 | L0 | | 0 | | | | | | |
| TV | 60 | L1 | | 1 | | | | | | |
| TV | 465 | L1 | | 1 | | | | | | |
| TV | 470 | L2 | | 2 | | | | | | |
| TV | 475 | L2 | | 2 | | | | | | |
| | | | | | | | | | | |
| Label | Skip line | | 1 | | | | | | | |
| Glitch | 1000 | | | | | | | | | |

*Figure 8C*

| Label | Second Signal 8 Text Line | | | | |
|---|---|---|---|---|---|
| T | | 15.5 | | 1 | |
| T | | 25 | c1 | | |
| T | | 35 | | | c2 |
| Label | Second Signal 9 Text Line | | | | |
| T | | 15.5 | | 1 | |
| T | | 25 | c1 | | |
| T | | 35 | | | c2 |
| Info | This text should not print! | | CloseBox | 0 | 9 |
| LV | Second Signal 7 Text Line | 15.5 | | 3 | |
| TV | | 20 | L0 | | 0 |
| TV | | 30 | L1 | | 1 |
| TV | | 40 | L2 | | 2 |
| TV | | 50 | L3 | | 3 |
| TV | | 460 | L2 | | 2 |
| TV | | 470 | L1 | | 1 |
| TV | | | L0 | | 0 |
| Label | Second Second Signal 7 Text Line | | | | |
| TV | | 10 | L2 | | 2 |
| TV | | 15 | | | 2 |
| TV | | 20 | L3 | | 3 |
| TV | | 25 | | | 3 |
| TV | | 30 | L2 | | 2 |
| TV | | 35 | | | 2 |
| TV | | 40 | L1 | | 1 |
| TV | | 45 | | | 1 |
| TV | | 50 | L0 | | 0 |
| TV | | 55 | | | 0 |
| TV | | 60 | L1 | | 1 |
| TV | | 465 | | | 1 |
| TV | | 470 | L2 | | 2 |
| TV | | 475 | | | 2 |
| Info | Show text #c cycles 30.2 to 66 ns | | Arrows | 1 | 30.2 | 66.8 |
| END | | | | | |

*Figure 8D*

EFFICIENT TIMING CHART CREATION AND MANIPULATION

BACKGROUND OF THE INVENTION

1. Field of the Invention

This invention relates generally to the field of creation and use of timing charts and particularly to computer-assisted production of such charts.

2. Background Information

In designing most digital and some analog systems, designers and engineers have long relied upon the use of timing charts to identify signal dependencies, race conditions, and the like. In a complex chart, a slight change in the timing of one signal may have ripple effects throughout the system, and many signals may be in need of alteration to accommodate such a change.

Prior to this invention, the engineer or draftsman needed to modify the drawing of the signals by hand or at least signal line by signal line on a computer screen in a manual way. The cost in terms of potential errors and person-time was and remains very high.

This has been a significant problem since the advent of complex electronic systems. It only gets worse as clock signals get distributed among more and more components on chips and circuit boards, different kinds of devices with different response times get mixed into systems and alternative processing capabilities get switched in or out for power conservation, increased system throughput based on variable demand and other considerations.

While the components of the system taught by the inventor do exist and are readily available, it is not seen anywhere that this problem has been addressed in the straightforward manner that it has been handled by the inventor herein.

BRIEF DESCRIPTION OF THE DRAWINGS

FIG. 5 is a graphic user interface illustration for initiating a new timing chart.

FIG. 6 is a graphic user interface illustration for adding clocks to a timing chart.

FIG. 7 is a graphic user interface illustration for adding new signals to a timing chart.

FIGS. 8A–D are a spreadsheet used by a preferred embodiment of the invention to create the timing chart of the FIGS. 3a and 3b illustration.

SUMMARY OF THE INVENTION

Figure 1:
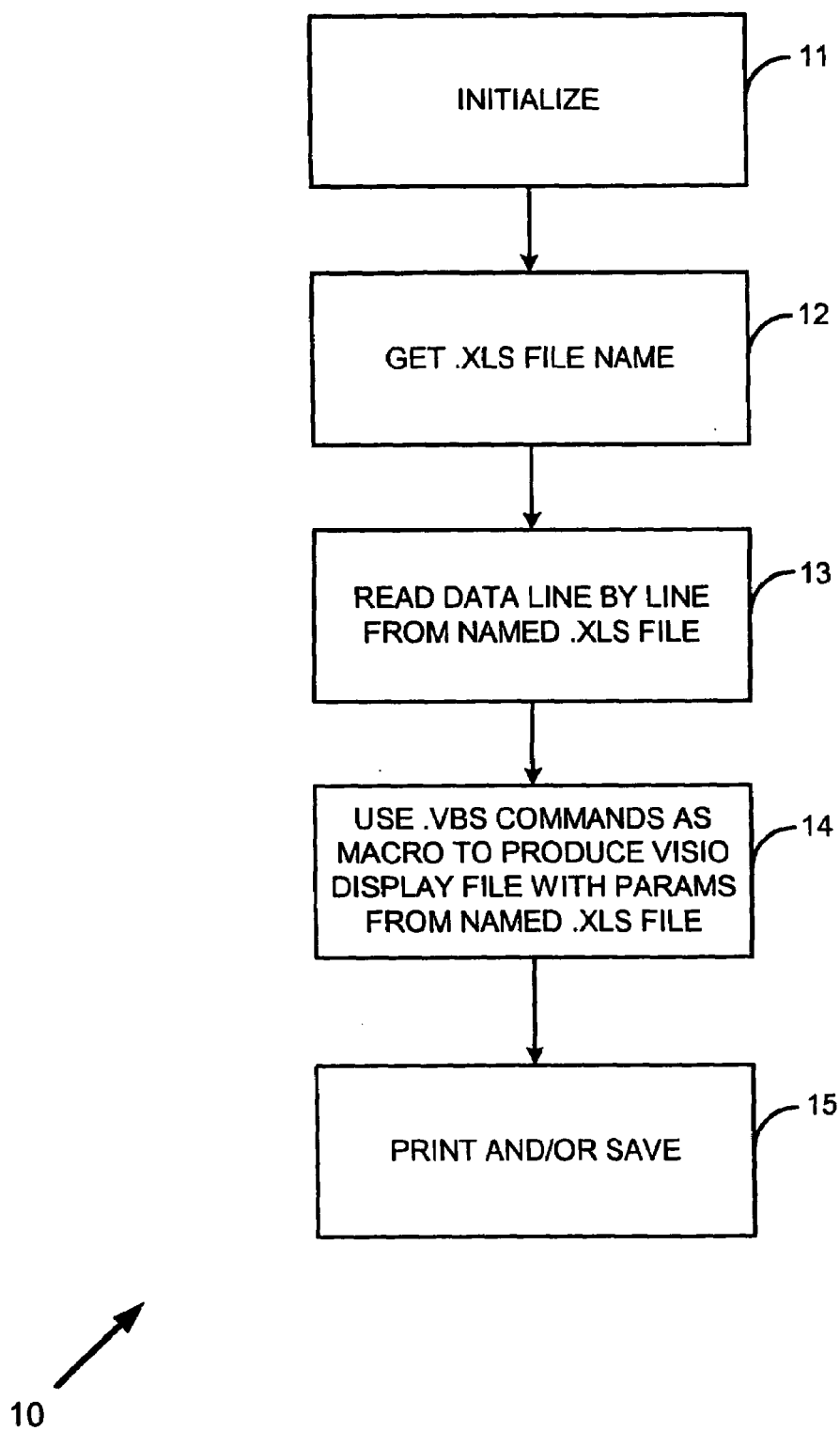
FIG. 1 is a flow chart illustrating a basic process of the invention.

The short-hand name for this invention is T-Chart, because it helps simplify the drawing of timing charts used by electrical and electronic engineers. A user of the invention will compile a spreadsheet file with appropriately arranged data corresponding to drawing parameters for each line in a timing chart. Using this file, a program will manipulate a drawing program to produce a timing drawing from the drawing parameters in the spreadsheet file. Because the data from the spreadsheet file is used by the invention to direct the drawing program, a user can change data in the spreadsheet to change the drawing. Because of the iterative change capacity of the Excel spreadsheet program, a change in one data or formula cell can ripple through to other cells that are dependent on that cell. The result will be automatically used to update the timing chart drawn from the revised spreadsheet file. Thus, data dependencies that were embodied in the spreadsheet will ripple through and modify dependent data automatically.

The particular components of this system are commonly known. In the preferred embodiment, the inventor uses the Microsoft® Excel® program as the spreadsheet program, and has created templates for ease of organization of the data into the appropriate format that the controlling program will use. The controlling program is written in Visual Basic®, which provides a macro-like interface to the drawing program. The drawing program of the preferred embodiment is VISIO®, also a Microsoft product. The preferred embodiment avoids any likelihood of incompatibility by using products all from the same company, Microsoft, headquartered in Washington State. It is within the skill of the ordinary software writer to produce the invention in an alterative form using any drawing program that will respond to commands such as the ones used and described herein, with any programming language that can give such commands that can also pull data from a spreadsheet file.

Also, it should be noted that where within a timing diagram drawing, there are dependencies, if the user uses formulae instead of hard numbers in the spreadsheet file, the ripple-through recalculation process that the spreadsheet program performs will also cause a ripple-through re-jiggering of the drawing to comply with the new data.

Accordingly, the inventors have described the invention in detail in the next section, with reference to the figures, briefly described above.

DETAILED DESCRIPTION OF THE PREFERRED EMBODIMENTS

Refer first to FIG. 1 in which a flow chart 10 illustrates the basic functions of a preferred embodiment of the invention. Initialization 11 occurs by starting the program by the user, which sets up a blank file to hold the information that will be needed and prepares the formatting that will be required. It is assumed that the user has already created a spreadsheet file, which will be used, but if not, the user can build one. This building of a spreadsheet file for the operation of this invention can be done using macros that operate through a graphic user interface, and we disclose three such GUI models in FIGS. 5–7. In any event, once the spreadsheet file is created, after the T-Chart program is initiated, the program needs to know the name of the file and to obtain it 12 from a directory the user may indicate to the T-Chart program. At this point, the T-Chart program can read the data from the named spreadsheet file, and use its commands to run a plotting program, in order to display the timing chart that is the result of the parameters from the spreadsheet. The step 14 thus produces the display file, which the user can then save or print out 15, as he may desire.

The preferred embodiment uses the Microsoft® Excel® program as the spreadsheet program, and thus the spreadsheet files are terminated with a ".xls" suffix. The preferred controlling program of the preferred embodiment is written in Visual Basic®, so the files it uses are terminated with a ".vbs" suffix. The drawing program of the preferred embodiment is VISIO®, so the files it uses are terminated with a ".vsd" suffix.

Figure 2:
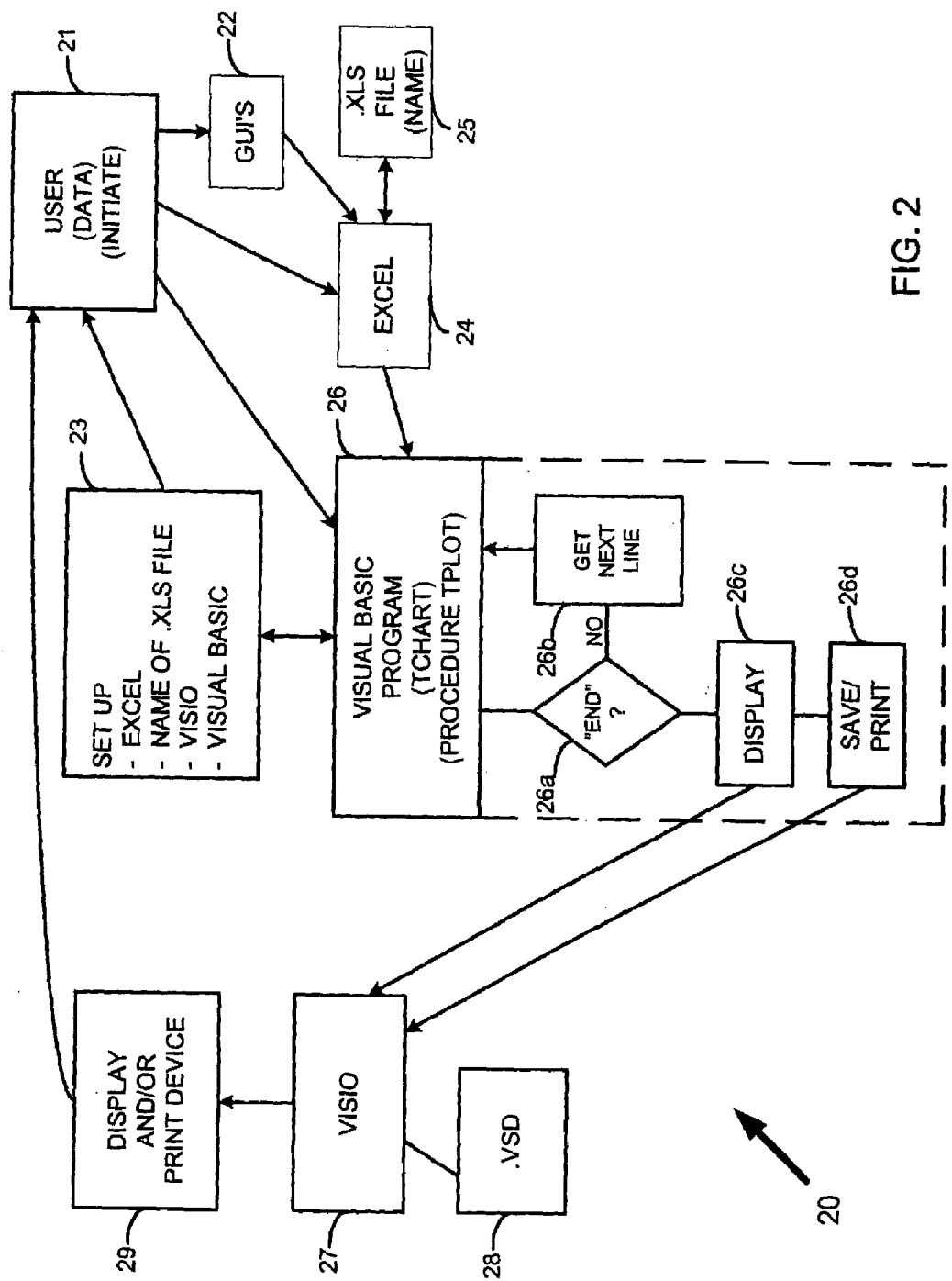
FIG. 2 is a block diagram illustrating the elements of a preferred form of the invention and their interaction.

The operation of the invention can be seen through the FIG. 2 block diagram 20, in which the user 21 can enter data or initiate the process. The user can enter data directly into the spreadsheet program 24 (in the preferred embodiment this is Excel) by using Excel-constructed Graphic User Interface (GUI) macros 22, or directly. The spreadsheet program in the preferred embodiment will manage the data files 25, which, when using Excel will be marked with a ".xls" extension.

The User will initiate the operation of the visual basic program 26 when desired. The visual basic program will prompt the user or automatically, as the case may be, set up the required environment by opening the spreadsheet program, getting the name of the spreadsheet data file, and opening the drawing program. In the preferred embodiment the spreadsheet program is Excel 24, the drawing program is Visio 27, and the user specifies a spreadsheet data file 25 in the format "filename.xls." After initialization the procedure called TPlot in the Visual Basic program 26 is called upon to get the data from the spreadsheet data file 25. It queries the spreadsheet program in the preferred embodiment, although one could have it obtain the data file and pull data directly from the data file with alternative systems. However, since access to .xls files is more easily obtained using the Excel program, that is preferred. After each line of the data file is reviewed, interpreted and the results sent to the drawing program 27, the procedure TPlot checks to see if it has found an END statement in the data file 26a. If not, it calls for the next line from the Excel data file 26b. Either when the last line has been reached or on a line-by-line basis, the result can be displayed on an associated display device 29 by the drawing program 27 by the TPlot procedure 26c. When complete, the user may save the plot file (.vsd if using VISIO) 28, and/or ask to have it printed by the drawing program on a printer device 29.

The user may modify this data by providing user modifications 21 after viewing either the display 29 or the print from 29.

Figures 3, 3A:
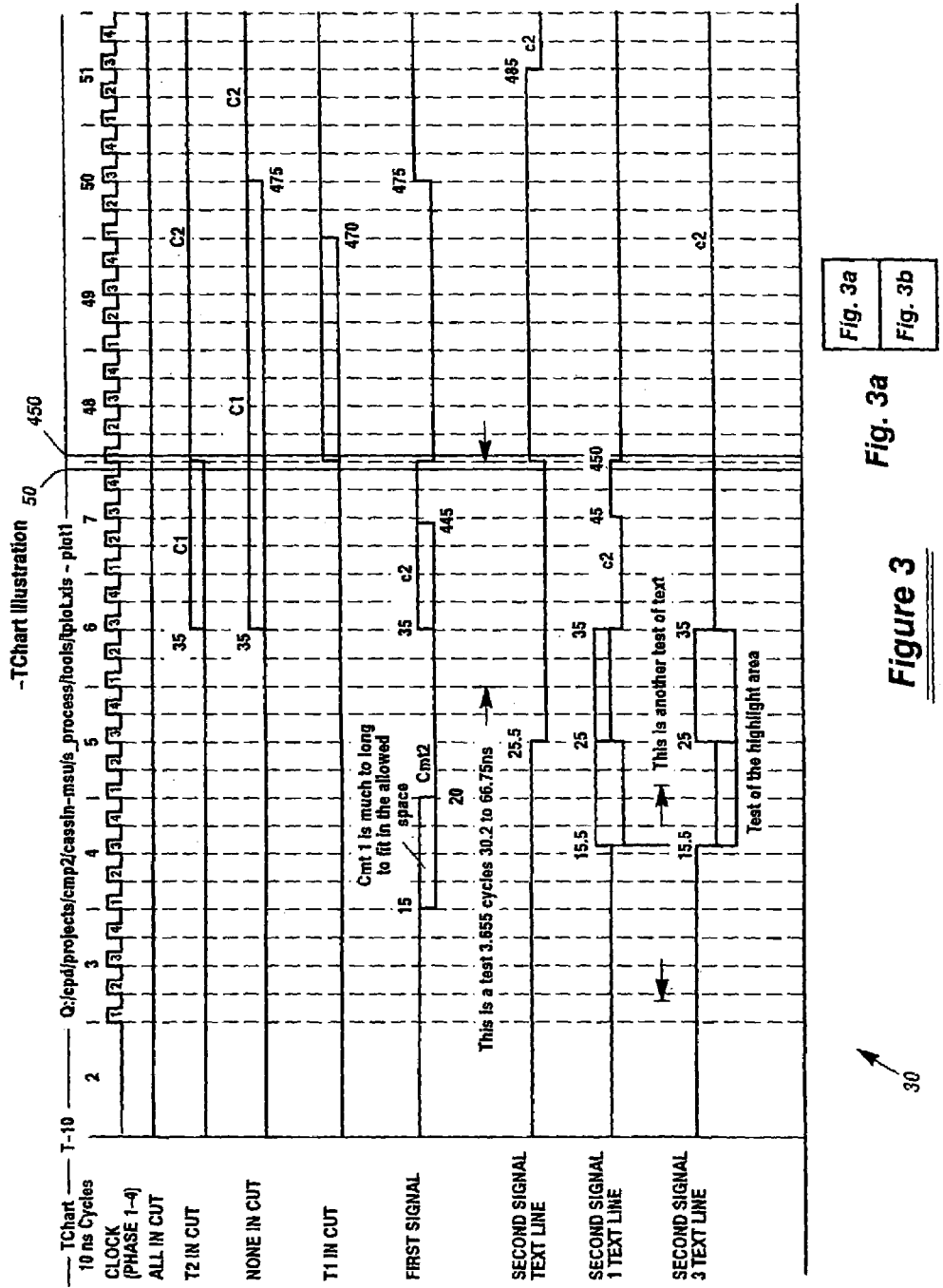
FIGS. 3a and 3b are a timing chart created from the spreadsheet illustrated in FIGS. 8A–D.
Figure 3:
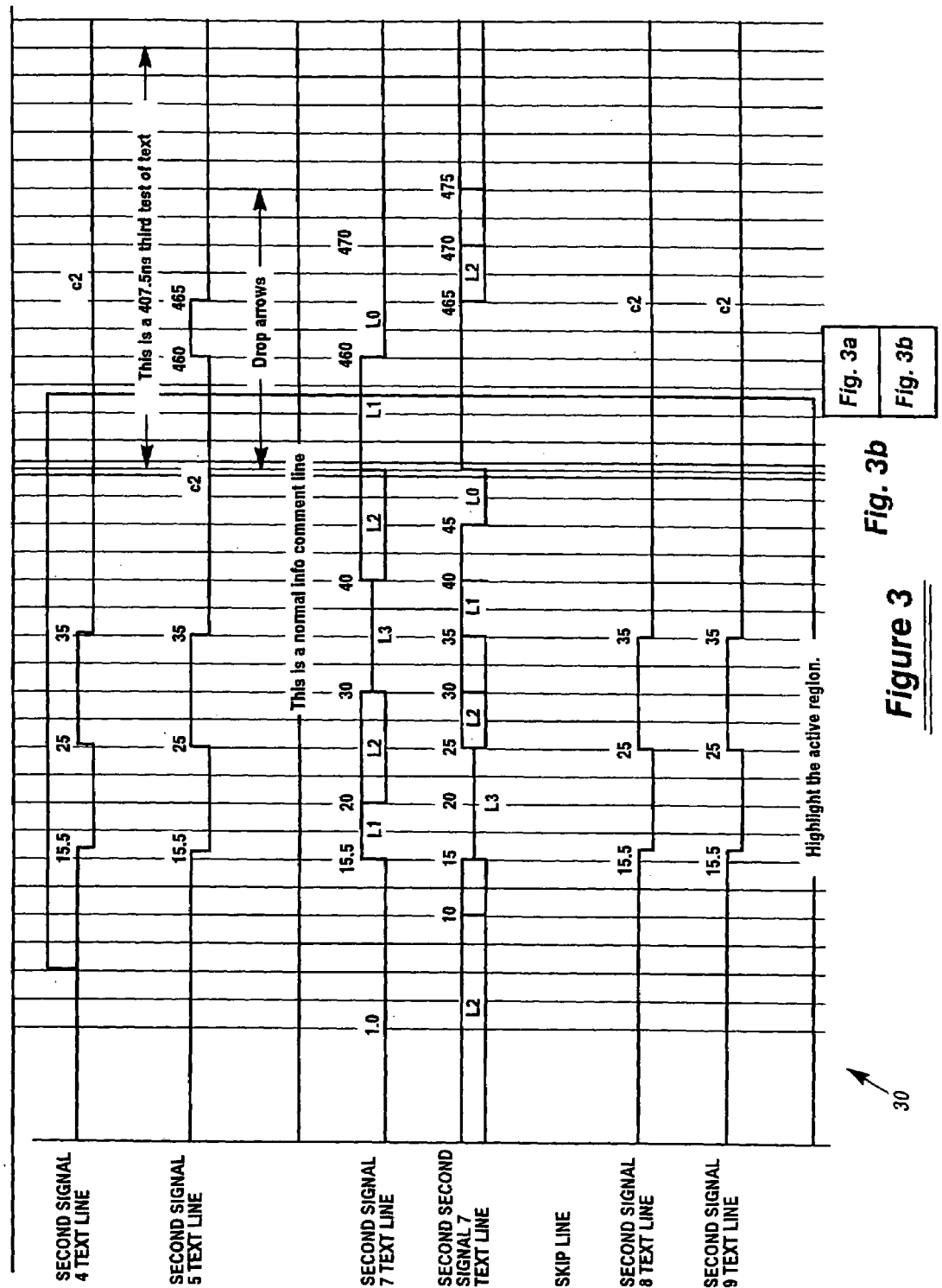

FIGS. 3a and 3b illustrates a sample drawing or plot of a timing chart 30 drawn from the spreadsheet file represented in FIGS. 8A–D.

Figure 4A:
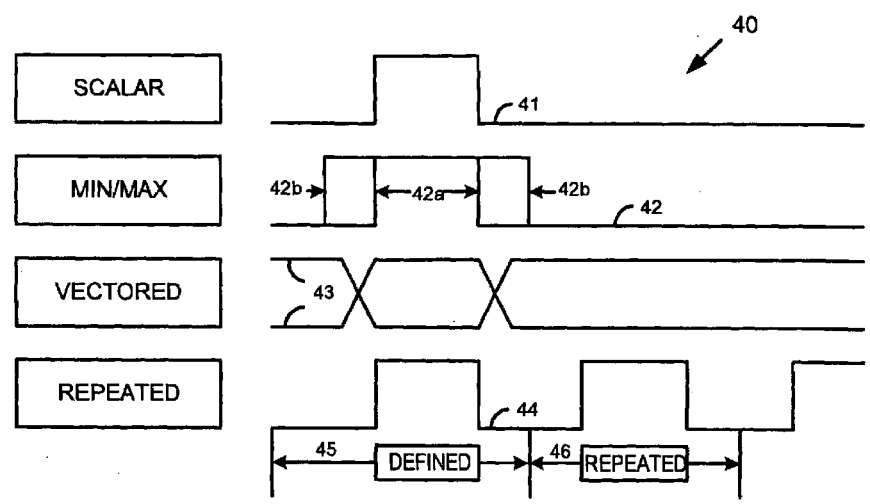
FIG. 4A is a heuristic timing diagram.

While most of this will be familiar to one of skill in the timing chart art, it is well to discuss the kinds of signals represented here, generally first before describing other details. Refer then to FIG. 4A, illustrating the four main kinds of signal patterns illustrated in timing charts. Others can be used as well, but these basic kinds will suffice for purposes of this discussion. The first signal line 41 shows a basic single-pulse scalar signal, having a single rise and fall designating the duration of the pulse width. The second signal line 42 shows a minimum pulse width duration 42a and a maximum pulse width duration 42b, and such signals are called Min/Max type signals. The third signal line 43 shows a vectored signal line with transition times at the infection points. The fourth signal line 44 is like the first, in that it is scalar, however it could be any type. This is operated by defining a first segment 45 and indicating as a parameter in the spreadsheet file how many repetitions 46 will occur.

Figure 4B:
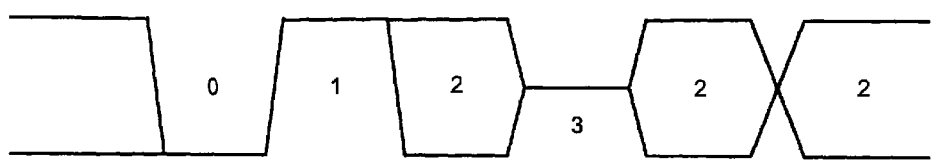
FIG. 4B is a heuristic timing diagram for explaining various vector signal commands.

FIG. 4B illustrates the various vector considerations and should be read with the description of the vector command at the end of the preferred embodiment command list.

The preferred embodiment command list is called TChart Commands and is reproduced as follows:

TChart Commands, General Comments.

Commands names and required option or variable fields are not case sensitive.

Except for the vectored label command only the first letter is used the rest of the field may be used for an internal comment. (Vectored label commands must begin with "L" and end with "V".)

The following commands are available for controlling the construction of a timing chart. Text in BOLD CAPS is required, text in [square brackets] is optional. Text in *italics* indicates that command operation is reserved for future implementation.

Note: In all the command definitions that follow the commas "," in the definition line indicate that the next variable is to be placed into the cell in the next column of your excel spreadsheet!

C[ycles], TIME, NUMBER, FIRST, *CYCLES/PAGE*, OPTIONAL TITLE [, BREAK , RESUME]

The cycle command is required to establish the scale factor of the timing chart.

TIME is the base cycle unit for the chart.

NUMBER cycles of TIME unit width will be plotted in the chart area of the drawing.

The cycle plot is a series of increasing integers beginning with the integer FIRST separated by small vertical bars at the beginning of each cycle.

*CYCLES/PAGE* specifies the number of cycles on each page when NUMBER cycles is to be plotted across more than one page.

The OPTIONAL TITLE text will be used in place of the default "CYCLE" text if this field is present.

BREAK before time n. Place a gap in the plot of traces starting at time n. BREAK and RESUME are a pair of times indicating the period where transitions will not be shown. A vertical gray box will be drawn to show the position of the gap.

RESUME at time n. Begin plotting traces after the gap starting at time n.

A Header command must precede the cycle command.

The cycle command will be retained for inclusion in the headers of following pages.

D[otted Transition], T1 [, Comment 1 [, T2 [, Comment 2]]]

The dotted transition command is the same as the Transition command shown below except that the lines are drawn as a series of dots. The command describes transition times for the traces.

T1 is the min. time transition (or the only transition) for this portion of the trace, Comment 1, if supplied, is the comment to be printed between transitions for t1 and t2 (comments always use normal text). If t2 and comment 2 are not supplied than comment one is used in place of comment 2.

T2 is the max. time transition for this portion of the trace. (The point at which the trace is totally at the opposite level of the transition.) If t2 is not supplied t1 becomes the only transition.

Comment 2 will be printed between this transition and the next or the end of line.

HINT: To place a dotted pulse above or below a solid line first place a hidden glitch at the point of the last transition of the dotted pulse then describe the dotted pulse using dotted transition commands.

Note that the dotted line begins at the point of the last transition (or the beginning of the trace).

D[otted Transition] V, T1, [Comment 1], FORMAT

The leading "D" and trailing "V" (case-insensitive) are required for this command.

The dotted transition command is the same as the Transition Vector command shown below except that the lines are drawn as a series of dots.

The leading "T" and trailing "V" (case-insensitive) are required for this command.

T1 is the time transition for this portion of the trace,

Comment 1, if supplied, is the text to be printed between the last transition and the transition at T1.

Format is the required vector level for the portion of the trace ending at T1. Format has four value choices, (0–3), (See T V command below!)

E[nd of plot]

TChart will plot traces from the first line to the last line of the source excel spreadsheet. If an End command is found processing will terminate even though there may be more entries beyond that point.

G[litch], T1, [Comment [, Type]]

The glitch command causes a transition to be plotted at the time specified without changing the current level of the trace. If timing values are being displayed they will be printed above the transition point.

T1 is the time for the specified transition.

Comment, if supplied, will be printed between this transition and the following transition or the end of line. Hidden glitches may be used to place comments before the first transition of a signal or on a specific area of the line.

Type, if supplied, is one of the following:

| | |
|---|---|
| > | Add a short right tail to the free end of the transition. |
| _ | Add short left and right tail to the free end of the transition. |
| < | Add a short left tail to the free end of the transition. |
| ~ | Hidden glitch. A solid line is drawn to the transition point but not the transition or time value. This is useful for positioning comments along a segment of a trace. |
| \| | No tail is attached (Default). |

H[eader], [Header Text], [Base]

The header command defines the page title and the time value for the left edge of the drawing.

Header Text, if supplied, will be printed at the top of each page of the output until a new Header command is given. A new Header command will cause the current page to be closed and a new page to be started.

Base sets an offset time as the value for the left edge of the charting area. The default base is 0.0.

Times supplied in following commands that are less than the Base value will not appear on the chart.

I[nfo], [Info Text], [Command, Type, T1, T2]

The info command supplies various forms of information to be placed on the drawing other than timing trace information.

Info commands must be placed at the end of a plot description since they will terminate any transition timing being processed.

Command is optional. If supplied then see specific requirements for the Type, T1, and T2 fields. The allowed command entries are: "None entered", Arrows, BeginArrow, EndArrow, OpenBox, and CloseBox.

No Command (Type, T1, and T2 ignored)

The supplied Info Text will be printed, center justified, in the chart area between a set of double lines. A centered line will be placed in the signal text area at the left of the drawing to help indicate the locations of info text.

A[rrows], Type, T1, T2

This command places a pair of marker arrows on a separate plot line with attached comment text. If the character sequences "#T" or "#C" are included in the text they will be replaced with the value of the time or the number of cycles between T1 and T2 respectively.

Type is currently defined as a 1. Other numbers are reserved for future enhancements.

T1 is the time at which the first arrow is placed.

T2 is the time at which the second arrow is placed.

Info Text is the comment text to be placed with the arrows. Placement is dependent on the location and spacing of the arrows.

B[eginArrow], Type, T1, T2

This command marks the location in the previous trace from which a dotted line will be dropped to an accompanying EndArrow command.

Type (1–10) is the number of the Begin/EndArrow set being specified.

T1 is the time at which the drop for the first arrow is placed.

T2 is the time at which the second arrow will be placed.

Info Text is the comment text to be placed with the arrows. Placement is dependent on the location and spacing of the arrows. If the character sequences "#T" or "#C" are included in the text they will be replaced with the value of the time or the number of cycles between T1 and T2 respectively.

E[ndArrow], Type

This command marks the location where the arrow set is to be placed in the drawing. The dotted line dropped from T1 of the BeginArrow command is terminated and the marking arrows and comment text is entered.

The EndArrow command must be placed at the end of a trace definition since it will terminate the trace and create a new line on the drawing.

Type (1–10) is the number of the Begin/EndArrow set being specified.

O[penBox], Type, T1, T2

The OpenBox command marks the left and right boundaries of a point above the previous trace from which a shaded box will be drawn to corresponding points below an accompanying CloseBox command.

Type (1–10) is the number of the Open/CloseBox set being specified.

T1 is the time at which the left edge of the box is placed.

T2 is the time at which the right edge of the box will be placed.

Info Text is the comment text to be placed within the bottom edge of the box. If the character sequences "#T" or "#C" are included in the text they will be replaced with the value of the time or the number of cycles between T1 and T2 respectively.

C[loseBox], Type
> This command marks the location where the bottom of the shaded box set is to be placed in the drawing.
>> Type (1–10) is the number of the Open/CloseBox set being specified.

L[abel], [Label Text], LEVEL
> The label command is required to define the beginning of each trace of the drawing.
>> The Label Text, if supplied, (app 20–25 characters depending on the number of caps) will be printed, center justified on the left margin of the timing trace that is to follow. If more characters are used the text will wrap in the allowed area. Up to three lines of wrapped text is generally the limit for readability.
>> The initial LEVEL must be a 0 or 1 and is the base level of the timing trace to follow. (Required)
>> Each label command marks the beginning of another trace. Traces that are in progress will be completed at their current level to the right margin of the drawing.

L[abel] V, [Label Text], FORMAT
> The vectored label command is similar to the label command except that it defines the beginning of a trace that is in vectored format.
>> The leading "L" and trailing "V" (case-insensitive) are required for this command.
>> The Label Text, if supplied, (app 20–25 characters depending on the number of caps) will be printed, center justified on the left margin of the timing trace that is to follow. If more characters are used the text will wrap in the allowed area. Up to three lines of wrapped text is generally the limit for readability.
>> The FORMAT must be a 0, 1, 2, or 3 and specifies the initial level of the timing trace to follow. (Required). If the FORMAT on the LV command matches the FORMAT on the first DV or TV command then no transition is indicated at T0. If they are different an appropriate transition mark is drawn.
>>> 0 Drawn as one line at the bottom as though all bits of the vector are zeros.
>>> 1 Drawn as one line at the top as though all bits of the vector are ones.
>>> 2 Drawn as two lines, one at the top and one at the bottom of the trace.
>>> 3 Drawn as one line at the midpoint of the trace (Tri-state).
>> Each label command marks the beginning of another trace. Traces that are in progress will be completed at their current level to the right margin of the drawing.

M[arker], T1 [, t2 [, t3], tn]]]
> A light dotted vertical line will be drawn across the page at the time[s] specified.
>> Each of the times T1-n specifies the point in time at which a vertical line will be drawn.

M[arkers], R[epeated], Number of repeats, Repeated cycle time, T1 [, t2 [, t3], tn]]]
> A light vertical line made up of varying patterns of dots and dashes will be drawn on the page at the times specified. Each of the times T1, t2, etc. will have a different pattern. All specified patterns will be repeated for each repeated cycle until the end of the cycle count, or the right margin is reach.
>> R is a letter indicating that this is to be a repeated marking pattern.
>> NUMBER specifies the number of repeated patterns to plot. If NUMBER is zero the pattern will be repeated until one of the lines reached the right margin of the page.
>> The repeated cycle time determines the period of the pattern. (If the time is 10 then 10 will be added to each of T1, t2 etc. for each repeated pattern.
>> Each of the times T1-n specifies the point in time at which a vertical line will be drawn. At least one time must be specified.

O[ptions], O1 [, o2 . . . [, o5]]
> (Note: Use a single tick mark (') to precede the + or − in your excel spreadsheets to prevent excel from attempting to interpret your entry as a number!)
>> Options O1–5 may be any of the following:
>>> +A Adjusts text to print only with a minimum separation to prevent the numbers from being on top of each other.
>>> −A Prints all number text. (Default)
>>> +B Prints a border around the page with the header information in the lower lines of the page. (Default)
>>> −B Plots page with no border or header. Spacing and margins are set up to allow insertion into other documents (Word etc.). Must precede the header line to be included on the first page.
>>> +C Sets the color of the following text and lines to one of the following:
>>>> +Cred, +Cgreen, +Cblue, +Cyellow, +Cviolet, +Ccyan.
>>> −C Returns the text and line color to black. (DEFAULT)
>>> +L Set the page format to Landscape. (DEFAULT)
>>>> If a chart has been started this will also start a new page. This command must precede any other commands in order to have the first page in portrait format. Options +−B and +−S must precede this option if they are to be applied to the new page.
>>> −L Set the page format to Portrait.
>>>> If a chart has been started this will also start a new page. This command must precede any other commands in order to have the first page in portrait format. Options +−B and +−S must precede this option if they are to be applied to the new page.
>>> +N Display timing values below the charted transition point for T2 timing entries. (Default)
>>> −N Do not display timing values below the T2 charted transition point. (Does not affect transition timing values above the charted transition points. Compresses the distance between plotted lines by the amount of the text height.)
>>> +T Display transition timing values above and below that charted transition points. (DEFAULT)
>>> −T Do not display timing value text.
>>> +S Specify the page size for the plot. Sizes available are A–E. Pages B–E are only available on the plotter. Must precede the header line to be included on first page.
>>> −S Same as +S.
>>> +Z Display ".0" on values that end as an integer.
>>> −Z Do not display ".0" on integer values. (DEFAULT)
> Option commands that precede the first Label command will be included in the headers of the following pages.

The T and Z options may be changed as desired throughout the body of the page and will carry over into charts that follow on automatically generated new pages.

P[hase], WIDTH, OFFSET, [Level], [Name Text], [Cycle Time]

Phase commands generate a pulse for each cycle defined in the cycle command above. Only the initial transition of each phase will be labeled with the time value.

WIDTH is the width in time units of the active portion of the phase pulse beginning at the start of each cycle plus OFFSET.

Level is the initial level of the phase (1 or 0) (Default level is 0).

Name Text is the label to be printed to the left of the phase plot line.

Cycle Time allows the user to specify a cycle time other than the one specified in the CYCLE command without changing the base cycle of the plot.

Phase commands that precede the first label command will be included in the headers of following pages.

R[epeat], [Label Text], [Level], TIME, NUMBER

The repeat command is like a non-vectored label command except that the transition commands (T, D, & G) that follow it are repeated NUMBER times using TIME as the width of the repeat cycle.

The Label Text, if supplied, (app 20–25 characters depending on the number of caps) will be printed, right justified on the left margin of the timing trace that is to follow. If more characters are used the text will wrap in the allowed area. Up to three lines of wrapped text is generally the limit for readability.

The initial LEVEL must be a 0 or 1 and is the base level of the timing trace to follow. (Default level is 0).

Each repeat command marks the beginning of another trace. Traces that are in progress will be completed at their current level to the right margin of the drawing.

Repeat commands that precede the first label command will be included in the header of following pages.

T[ransition], T1 [, Comment 1], [T2 [, Comment 2]]

The transition command describes the transition times for the traces; points where the trace switches from one logical level to another.

T1 is the min. time transition (or the only transition) for this portion of the trace, Comment 1, if supplied, is the comment to be printed between transitions for t1 and t2. If t2 is not supplied than comment one is not used.

T2, if supplied, is the max. time transition for this portion of the trace. (The point at which the trace is totally at the opposite level of the transition.) If t2 is not supplied t1 becomes the only transition.

Comment 2, if supplied, will be printed between this transition and the next or the end of line.

T[ransition] V, t1, [Comment 1], FORMAT

The vectored transition command describes the transition times for the traces; points where the trace switches from one logical level to another.

The leading "T" and trailing "V" (case-insensitive) are required for this command.

T1 is the time transition for this portion of the trace,

Comment 1, if supplied, is the text to be printed between the last transition and the transition at T1.

Format is the required vector level for the portion of the trace ending at T1. Format has four value choices, (0–3), where:

0—is a trace segment drawn only at the lower (0) level of the trace,

1—is a trace segment drawn only at the upper (1) level of the trace,

2—is a pair of traces drawn at both the lower and upper level of the trace, and

3—is a trace segment drawn at the mid point of the trace. (See FIG. 4B).

Figure 5:
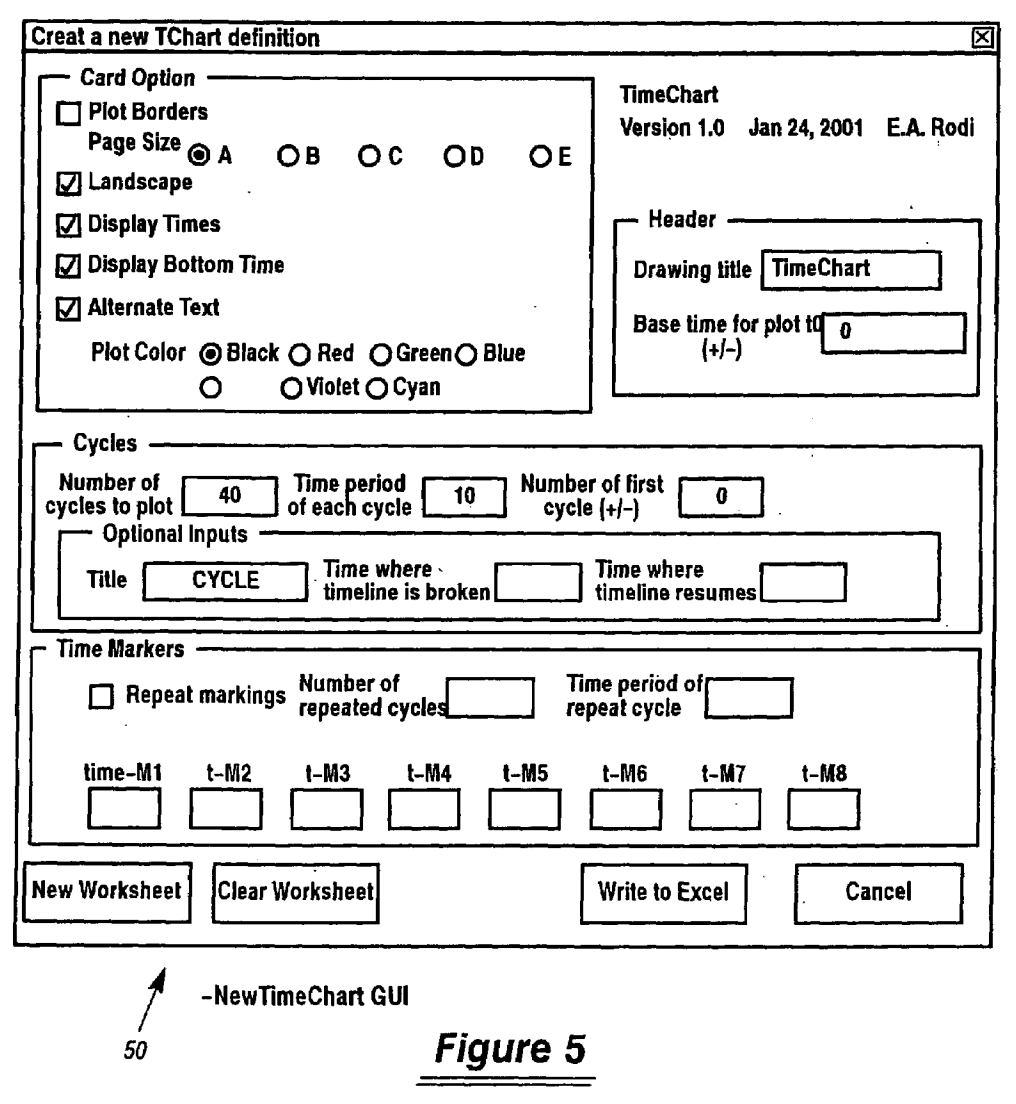
Figure 6:
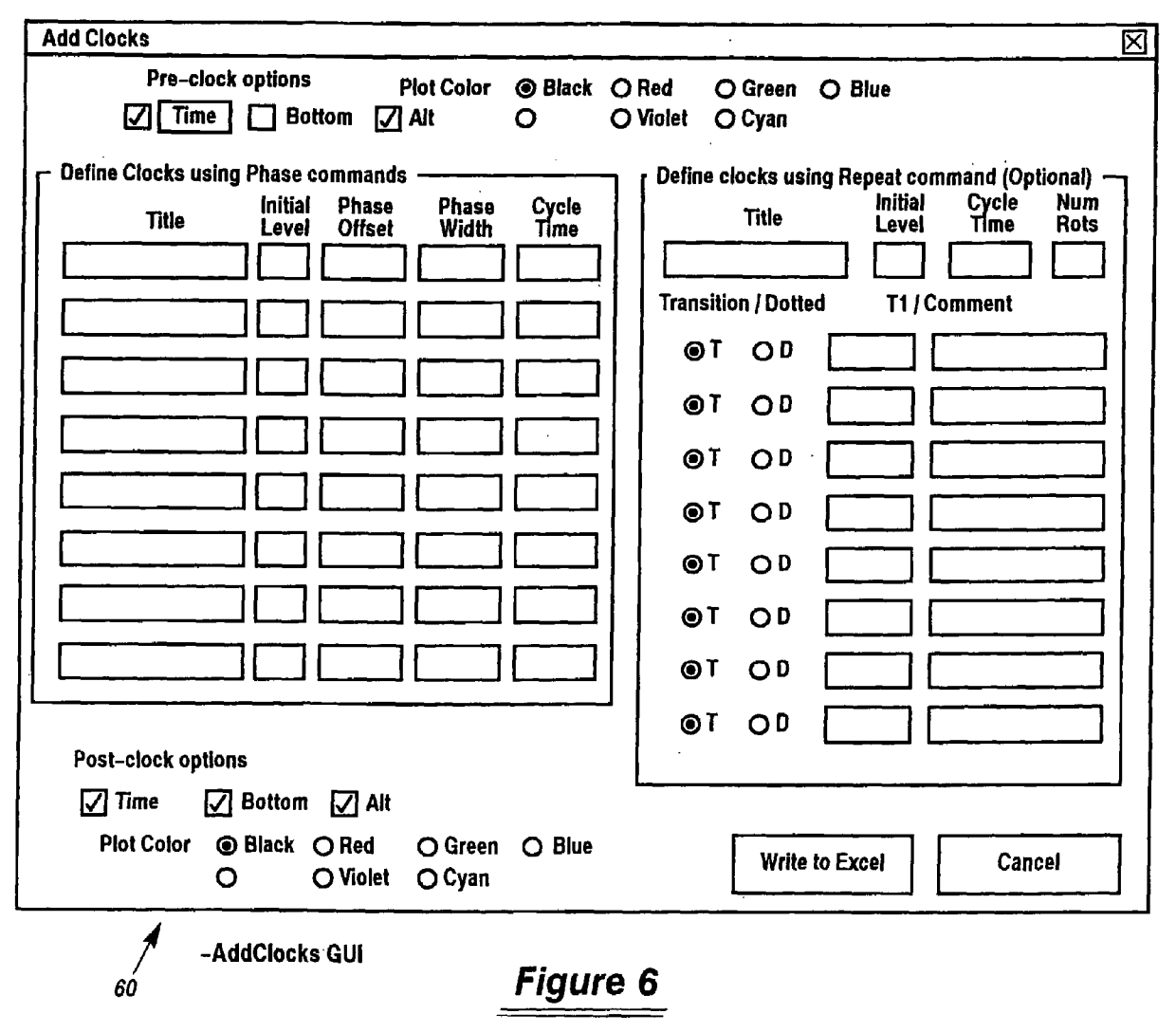

The first draft of a timing chart can easily be created through the use of graphic user interface static screens such as are illustrated in FIGS. 5–7, screens 50, 60, and 70, respectively. These can be called through the Visual Basic T-Chart program by a user. In FIG. 5's screen 50, a new worksheet can be started or one may be cleared using this screen. When the appropriate information is entered in the screen, the button marked "Write to Excel" can be clicked to cause the code supporting this screen to generate a spreadsheet file (.xls file), which using the data entered in the space "Drawing title" would be called "TimeChart". Clearly, these screens could be modified to suit a particular environment where other basic functions will be needed for an organization's time charts to include them, and rearrangement may be desirable as well. The next screen 60, FIG. 6, allows for the addition of clocks, and the screen in FIG. 7, (70) adds one-signal lines. It may be easier to work directly with the spreadsheet file through the spreadsheet program to modify the timing chart and produce additional drafts of the .xls file, once the format of the file is created by the macros using the GUIs.

Refer now to FIGS. 3a and 3b in tandem with FIGS. 8A–D.

The first column of the .xls file is used to indicate to the TChart program (the TPlot procedure therein) a command for drawing something, so the list of commands is reviewed and the appropriate one found by the TPlot procedure. Thus O or Options is first checked reading the first column in the first line (or row). A plus lower case "L" appears in the second column, which means set the drawing to LANDSCAPE mode. The minus capital "B" in the next column means to have no border. Then the next line is read by the TPlot procedure in the TChart Visual Basic program. The next line starts with "H" meaning header information will be in this row, and it will be printed in the first line of the display or print-out/plot. As a convenience, the authors have placed the pathname in this line automatically.

The next line is defining the cycle timing. IT provides the length of each cycle, the number (header or names) of each cycle (2–51, an indication where a break will be placed in the printed chart (between 50 and 450 time units), and specifies the length of a time unit.

The clock phases are defined in the next line. A minus "T" indicates no timing data to be displayed. The next line identifies the clock phases and displays a title as per the title given in the second column, starting at time=zero and repeating at 10 time units. The next rows define where the phases are to be reported within each cycle. Note that because we are using a spreadsheet, the 10 unit time cycle time can be broken easily into four congruent segments by using a formula in the second "T" (transition) row for this line where the formula is current column at row this minus 1+1.25, and rippling this formula down. The result will be a variable to be supplied by the user in the first row (here it's zero), followed by an incremental advance of 1.25 time units as one moves down the row. This and similar uses of formulae within spreadsheet cells is commonly understood, and can be put to good use anywhere some value should be dependent on another within the timing chart.

Vertical lines can be introduced into the chart lines using the Mark command, and here, in the next row after a blank row is a Mark command that writes all its marks into the cut between cycle 10 and cycle 48, so no display appears in FIGS. 3a and 3b.

The visible signal line from the spreadsheet row starting "Label", "First Signal" is a base level 1 (meaning it starts at "hi"). The first transition is at 10 time units, and comment 1 (C1) is placed at that transition. In FIG. 3 this shows up at the transition between the $3^{rd}$ and $4^{th}$ cycle, 20 nanoseconds from the −10 line, which is 10 ns from the zero line at the start of cycle 3.

The rest of the operation is fairly straightforward and requires little further explanation, but there are a couple of items worth mentioning.

Toward the bottom of FIG. 8B, the row marked "Info/Mark #T ns. Third test of text" causes arrows to be drawn between the text box and points at 80 and 488 nanoseconds (the time units of this figure), and the calculation result is placed into the "#T" symbol in its location within the label. You will note that on FIGS. 3a and 3b this calculation is 0.5 ns off. This is because the column in the spreadsheet row where the 488 appears has been shortened and the rounding error has been introduced into the .xls display, but since the TPlot procedure gets its data from the Excel program, the original number, 487.5 (not shown) is used in the calculation. This is a calculation done in the Visual Basic program TChart, not by Excel, in this case.

Another feature worth noting is illustrated with reference to the bottom of FIG. 8C showing a label "Skip line" and in the next line a Glitch being forced to appear off the right side of the page. Later versions of the program allow a statement Skip Line to be handled by a new command of that name, to allow an unlabeled line skip.

Finally, the appearance of the word "END" in a first column indicates that any data following that is to be ignored and that the TPlot routine has completed its work with respect to this .xls spreadsheet file. Data after that can be used for referenced formulae for calculations, holding drafts of lines, and the like as may be desired by the user.

The user can create any number of similar .xls files using commands like the ones described herein, and the principles just described can be used with other spreadsheet programs as may be desired and produced by the reader.

The TPlot routine that is the main subroutine or .vbs procedure in its currently preferred form is reproduced below:

```
Public Sub TPlot( )
    Dim PathName As String
    Dim FileName As String
    Dim WorkSheetName As String
    Const StartRow = 1
    Const EndRow = 10000
    Dim t1 As Double
    Dim t2 As Double
    Dim t3 As Double
    Dim c1 As String
    Dim c2 As String
    Dim opt As String
    Dim typ As Integer
    Dim n As Integer
    Dim first As Integer
    Dim TestStr As String
    Dim MyXL As Object ' Variable to hold reference to Microsoft Excel.
    Dim Ws As Object
    Dim ExcelWasNotRunning As Boolean ' Flag for final release.
    Dim DotHold As Boolean
    'Create a new document
    Set DocumentObj = Documents.Item(1)
    Set PagesObj = DocumentObj.Pages
    'Ask to Delete old pages and restart
    oldPages = PagesObj.Count
        n = MsgBox("I found " & oldPages & " pages in this drawing." & Chr(13) & Chr(13) & "May I delete them all?", vbYesNo, VerTxt)
        If n = vbNo Then
            n = MsgBox("Do you want to start this drawing on a new page?", vbYesNoCancel, "Question:")
            If n = vbYes Then
                Set PageObj = PagesObj.Add
            ElseIf n = vbNo Then
                Call MsgBox("Please delete unwanted pages before restarting TChart!" & Chr(13) & Chr(13) & "Note: Menu items 'Edit/Drawing Page' and 'Edit/Go to' will" & Chr(13) & " allow you to maintain pages within your drawing!", vbInformation)
                Exit Sub
            Else
                Exit Sub
            End If
        ElseIf n = vbYes Then
            While oldPages > 1
                Set PageObj = ActivePage
                PageObj.Delete 1
                oldPages = oldPages − 1
            Wend
        End If
```

-continued

```
'Clear all lines from a possible old drawing
ActiveWindow.SelectAll
ActiveWindow.Selection.Delete
'Set the default to landscape mode
DocumentObj.PrintLandscape = 1
Call SetDefaults
Call SetUpVars ' Load the initial values
'Read path/file/worksheet name defaults
Path Name = GetSetting("TChart", "Defaults", "PathName", "Q:/cpd/projects/cmp2/mem/")
FileName = GetSetting("TChart", "Defaults", "FileName", "tplot")
WorkSheetName = GetSetting("TChart", "Defaults", "WorkSheetName", "PLOT")
PathName = InputBox("Enter Excel Pathname", , PathName)
If PathName = "" Then
    MsgBox ("Path is required! TChart terminated.")
    Exit Sub
End If
FileName = InputBox("Enter Excel Filename", , FileName)
If FileName = "" Then
    MsgBox ("File name required! TChart terminated.")
    Exit Sub
End If
WorkSheetName = InputBox("Enter the sheet name", , WorkSheetName)
If WorkSheetName = "" Then
    MsgBox ("Excel sheet name required! TChart terminated.")
    Exit Sub
End If
'   n = MsgBox("Compress Output File? (Reduces file size, but adds processing time)",
vbYesNo, "Question:")
'       If n = vbYes Then
'           ReduceSize = 1
'       End If
ReduceSize = 0
'Save path/file/worksheet name defaults
Call SaveSetting("TChart", "Defaults", "PathName", PathName)
Call SaveSetting("TChart", "Defaults", "FileName", FileName)
Call SaveSetting("TChart", "Defaults", "WorkSheetName", WorkSheetName)
FileName = PathName & FileName
If InStr(1, FileName, ".xls", vbTextCompare) < 2 Then
    FileName = FileName & ".xls"
End If
SSFileName = FileName
SSSheetName = WorkSheetName
' Test to see if there is a copy of Microsoft Excel already running.
On Error Resume Next ' Defer error trapping.
' Getobject function called without the first argument returns a
' reference to an instance of the application. If the application isn't
' running, an error occurs. Note the comma used as the first argument
' placeholder.
Set MyXL = GetObject(, "Excel.Application")
If Err.Number <> 0 Then ExcelWasNotRunning = True
Err.Clear ' Clear Err object in case error occurred.
ExcelWasNotRunning = False
' Check for Excel. If Excel is running,
' enter it into the Running Object table.
DetectExcel
'Set the object variable to reference the file you want to see.
Set MyXL = GetObject(FileName)
' Show Microsoft Excel through its Application property. Then
' show the actual window containing the file using the Windows
' collection of the MyXL object reference.
MyXL.Application.Visible = True
MyXL.Parent.Windows(1).Visible = True
' Do manipulations of your file here.
Set Ws = MyXL.Worksheets(WorkSheetName)
For i = StartRow To EndRow
    If Abort Then Exit For
    TestStr = StrConv(Ws.Cells(i, 1).value, vbUpperCase)
    TestChr = Left(TestStr, 1)
t1 = 0
t2 = 0
c1 = ""
c2 = ""
ErrorMsg = "Error – " & ErrorCount & ", Excel line " & i
```

-continued

```
Select Case TestChr
    Case ""
        'Null input - Comment line - Ignored by TChart
    Case "T"            'Transitions *******************
        If NewLine Then
            Call CountErrors("Transition command out of order!", ErrorMsg)
            Exit For
        End If
        If InitialHdr Then
            HdrNdx = HdrNdx + 1
            For j = 1 To 5
                HdrSav(j, HdrNdx) = Ws.Cells(i, j).value
            Next j
        End If
        DotOn = False
        t1 = CDbl(Format(Ws.Cells(i, 2).value, dPlaces))
        c1 = Ws.Cells(i, 3).value
        If IsEmpty(Ws.Cells(i, 4).value) Then
            t2 = t1 - 1     'make sure t2 is not used later
        Else
            t2 = CDbl(Format(Ws.Cells(i, 4).value, dPlaces))
        End If
        c2 = Ws.Cells(i, 5).value
        If RepeatActive Then
            SavRptNdx = SavRptNdx + 1
            SavRpt(1, SavRptNdx) = "T"
            SavRpt(2, SavRptNdx) = CStr(t1)
            SavRpt(3, SavRptNdx) = c1
            SavRpt(4, SavRptNdx) = CStr(t2)
            SavRpt(5, SavRptNdx) = c2
        ElseIf Vector Then
            n = t2
            Call pLineV(t1, c1, n)
        Else
            Call pLine(t1, c1, t2, c2)
        End If
    Case "D"            'Dotted transitions *******************
        If NewLine Then
            Call CountErrors("Dotted command out of order", ErrorMsg)
            Exit For
        End If
        DotOn = True
        t1 = CDbl(Format(Ws.Cells(i, 2).value, dPlaces))
        c1 = Ws.Cells(i, 3).value
        If IsEmpty(Ws.Cells(i, 4).value) Then
            t2 = t1 - 1     'make sure t2 is not used later
        Else
            t2 = CDbl(Format(Ws.Cells(i, 4).value, dPlaces))
        End If
        c2 = Ws.Cells(i, 5).value
        If InitialHdr Then
            HdrNdx = HdrNdx + 1
            For j = 1 To 5
                HdrSav(j, HdrNdx) = Ws.Cells(i, j).value
            Next j
        End If
        If RepeatActive Then
            SavRptNdx = SavRptNdx + 1
            SavRpt(1, SavRptNdx) = "D"
            SavRpt(2, SavRptNdx) = CStr(t1)
            SavRpt(3, SavRptNdx) = c1
            SavRpt(4, SavRptNdx) = CStr(t2)
            SavRpt(5, SavRptNdx) = c2
        ElseIf Vector Then
            n = t2
            Call pLineV(t1, c1, n)
        Else
            Call pLine(t1, c1, t2, c2)
        End If
    Case "L"            'And "LV" Labels *******************
        InitialHdr = False
        Call eLine
        If Right(TestStr, 1) = "V" Then
            Vector = True
        Else
            Vector = False
        End If
```

```
        c1 = Ws.Cells(i, 2).value
        n = Ws.Cells(i, 3).value
        Call pLabel(c1, n)
        NewLine = False
    Case "G"         'Glitches ******************
        If NewLine Then
            Call CountErrors("Glitch command out of order", ErrorMsg)
            Exit For
        End If
        t1 = CDbl(Format(Ws.Cells(i, 2).value, dPlaces))
        c1 = Ws.Cells(i, 3).value
        c2 = Ws.Cells(i, 4).value
        If InitialHdr Then
            HdrNdx = HdrNdx + 1
            For j = 1 To 4
                HdrSav(j, HdrNdx) = Ws.Cells(i, j).value
            Next j
        End If
        If RepeatActive Then
            SavRptNdx = SavRptNdx + 1
            SavRpt(1, SavRptNdx) = "G"
            SavRpt(2, SavRptNdx) = CStr(t1)
            SavRpt(3, SavRptNdx) = c1
            SavRpt(4, SavRptNdx) = c2
        Else
            Call pGlitch(t1, c1, c2)
        End If
    Case "R"         'Repeats ******************
        Vector = False
        If InitialHdr Then
            HdrNdx = HdrNdx + 1
            For j = 1 To 5
                HdrSav(j, HdrNdx) = Ws.Cells(i, j).value
            Next j
        End If
        If RepeatActive Then 'This must be a new repeat command
            Call pRepeat    'So process the old one first
        End If
        RepeatActive = True
        NewLine = False
        SavRptNdx = 0
        RptText = Ws.Cells(i, 2).value 'Label text
        RptLevel = Ws.Cells(i, 3).value 'Initial level
        RptStep = CDbl(Format(Ws.Cells(i, 4).value, dPlaces))
        RptNum = Ws.Cells(i, 5).value
    Case "C"         'Cycle ******************
        If Not InitialHdr Then
            Call CountErrors("Header command must precede Cycle command!", ErrorMsg)
            Abort = True
            Exit For
        Else
            DotOn = False
            If RepeatActive Then Call eLine
            tCycle = Ws.Cells(i, 2).value 'Period of cycle
            nCycle = Ws.Cells(i, 3).value '# of cycles in plot
            tBase = (RE - T0) / (tCycle * nCycle)
            first = Ws.Cells(i, 4).value '# of first cycle
            n = Ws.Cells(i, 5).value '# of cycles to plot per page
            c1 = Ws.Cells(i, 6).value 'Optional text
            t2 = CDbl(Format(Ws.Cells(i, 7).value, dPlaces)) 'Break time
            t3 = CDbl(Format(Ws.Cells(i, 8).value, dPlaces)) 'Resume time
            Call pCycles(tCycle, nCycle, first, n, c1, t2, t3)
        End If
    Case "H"         'Header ******************
        DotOn = False
        If RepeatActive Then Call eLine
        Restore = False
        c1 = Ws.Cells(i, 2).value
        t1 = CDbl(Format(Ws.Cells(i, 3).value, dPlaces))
        Call pHeader(c1, t1)
        InitialHdr = True    'Capture the new header commands
        HdrNdx = 0           'Reset the header index pointer
    Case "M"         'Marks ******************
        If InitialHdr Then
            HdrNdx = HdrNdx + 1
            For j = 1 To 12
                HdrSav(j, HdrNdx) = Ws.Cells(i, j).value
            Next j
        End If
```

-continued

```
                DotHold = DotOn
                DotOn = False
                If IsNumeric(Ws.Cells(i, 2).value) Then 'Add random marks
                    n = 2
                    t1 = CDbl(Format(Ws.Cells(i, n).value, dPlaces))
                    While t1 > 0
                        Call pMark(t1, Dotted)
                        n = n + 1
                        t1 = 0
                        t1 = CDbl(Format(Ws.Cells(i, n).value, dPlaces))
                    Wend
                Else 'Add a repeated pattern of marks
                    MarkRepeats = Ws.Cells(i, 3).value '# of time to repeat cycle
                    MarkCycle = Ws.Cells(i, 4).value 'Period of cycle
                    Ts = 0
                    x = (nCycle + (T0Base / tCycle)) * tCycle
                    Do
                        n = 5
                        t1 = CDbl(Format(Ws.Cells(i, n).value, dPlaces))
                        While t1 > 0
                            If t1 + Ts + T0Base > x Then Exit Do
                            Call pMark(t1 + Ts + T0Base, n - 2)
                            n = n + 1
                            t1 = 0
                            t1 = CDbl(Format(Ws.Cells(i, n).value, dPlaces))
                        Wend
                        Ts = Ts + MarkCycle
                        MarkRepeats = MarkRepeats - 1
                    Loop Until MarkRepeats = 0
                End If
                DotOn = DotHold
            Case "P"           'Phases ******************
                DotOn = False
                If RepeatActive Then Call eLine
                t1 = CDbl(Format(Ws.Cells(i, 2).value, dPlaces))
                t2 = CDbl(Format(Ws.Cells(i, 3).value, dPlaces))
                n = Ws.Cells(i, 4).value
                c1 = Ws.Cells(i, 5).value
                t3 = Ws.Cells(i, 6).value
                NumPhs = NumPhs + 1
                SavPhs1(NumPhs) = t1
                SavPhs2(NumPhs) = t2
                SavPhs3(NumPhs) = 0
                SavPhs4(NumPhs) = n
                SavPhs5(NumPhs) = c1
                SavPhs6(NumPhs) = t3
                Call Phases(t1, t2, 0, n, c1, t3)
            Case "I"           'Info *****************
                If RepeatActive Then Call eLine
                c1 = Ws.Cells(i, 2).value
                opt = Ws.Cells(i, 3).value
                typ = Ws.Cells(i, 4).value
                t1 = CDbl(Format(Ws.Cells(i, 5).value, dPlaces))
                t2 = CDbl(Format(Ws.Cells(i, 6).value, dPlaces))
                Call pInfo(c1, opt, typ, t1, t2)
            Case "O"           'Options *****************
                If InitialHdr Then
                    HdrNdx = HdrNdx + 1
                    For j = 1 To 12
                        HdrSav(j, HdrNdx) = Ws.Cells(i, j).value
                    Next j
                End If
                If RepeatActive Then Call eLine
                Call Options(Ws.Cells(i, 2).value, Ws.Cells(i, 3).value, Ws.Cells(i, 4).value, Ws.Cells(i, 5).value, Ws.Cells(i, 6).value)
            Case "E"           'End *****************
                Exit For
        End Select
    Next i
    If XDot > T0 Or RepeatActive Then Call eLine
    'If Not Abort Then Call MsgBox("Drawing completed!", vbInformation, VerTxt)
' If this copy of Microsoft Excel was not already running when you
' started, close it using the Application property's Quit method.
' Note that when you try to quit Microsoft Excel, the Microsoft Excel
' title bar blinks and Microsoft Excel displays a message asking if you
' want to save any loaded files.
```

-continued

```
    If ExcelWasNotRunning Then
        MyXL.Application.Quit
    End If
    Set MyXL = Nothing ' Release reference to the application and spreadsheet.
        End Sub
```

This routine provides for the interpretation of the commands and the reading of the rows, line by line from the spreadsheet file and conversion to commands to be sent to the drawing program as was described more generally above it. The routine may of course be modified, in keeping with the teachings of this document, to provide additional features or modifications, as may be desired by the reader.

Thus we have described a program or set of programs that may guide a user through a creation of a spreadsheet file to be used by one of the programs procedures to create a timing diagram, plotable or printable by the user at will. Because of the use of the spreadsheet file, a user can easily manipulate any number of variables within the spreadsheet and rest assured that these changes will modify the resultant timing diagrams automatically and without any additional thought or effort on the user's part. In the preferred embodiment, off-the-shelf and related commercial software products are tied together to accomplish the result described, making construction of the end product quite straightforward.

It should be noted that the program will function within a computer memory system designed to run it, and may be moved from one computer system to another via electronic signaling or by being carried in a transportable medium such as a floppy disk or CD.

The only limit on the scope of the invention is set forth in the following appended claims.

What is claimed is:

1. A method of operating a drawing program comprising:
   capturing data from a spreadsheet program data file, said data including all information needed for generating one or more signal lines of a timing chart;
   interpreting, by said drawing program, at least one command contained within said data,
   each said command to be used by said drawing program to draw one of said signal lines or a header/format line;
   automatically generating, by said drawing program, said timing chart having each of said one or more signal lines and said header/format line incorporated therein.

2. The method of claim 1 wherein said data file contains multiple sets of lines of data that are read by said drawing program in a predetermined order.

3. The method of claim 2 wherein said data file may be displayed by using an EXCEL® spreadsheet program.

4. A method of operating a control program to draw a timing chart from a spreadsheet data file accessible through a spreadsheet program, the method comprising:
   capturing, by said control program, data from said spreadsheet data file, said data including all information needed to generate said timing chart;
   interpreting, by said control program, commands contained within said captured data to identify drawing actions to be accomplished by said drawing program and whereby said control program controls said drawing program in conformity with said commands to automatically generate one or more signal lines contained within said timing chart.

5. The method of claim 4 further comprising capturing data from said spreadsheet data file by requesting each line of data from said spreadsheet data file via said spreadsheet program which is actively running, and which is capable of being operated with, or without, said drawing program.

6. The method of claim 4 wherein said control program causes said drawing program to produce a display of said timing chart that is modified by said commands.

7. The method of claim 4 and further including providing a spreadsheet data file name to said control program to enable said control program to access said data from said spreadsheet program.

8. The method of claim 4 further comprising using said spreadsheet program to populate said spreadsheet data file with timing chart data, and wherein said spreadsheet program executes independently from said drawing program.

9. The method of claim 8 wherein said populating of said spreadsheet data file is accomplished, at least in part, using a graphical user interface operating on said spreadsheet program.

10. An apparatus for drawing a timing chart based upon data and commands in a spreadsheet data file comprising:
    a spreadsheet program;
    a drawing program that is capable of executing independently from said spreadsheet program; and
    a software program communicatively coupled to said spreadsheet program and to said drawing program, said software program to use said spreadsheet program to capture data and commands from said spreadsheet data file, said software program further to interpret said commands and to send said interpreted commands and said captured data to said drawing program, whereby said interpreted commands and said captured data provide all information required by said drawing program to generate said timing chart.

11. The apparatus as set forth in claim 10 wherein said software program is written in VISUAL BASIC®.

12. The apparatus as set forth in claim 10 wherein said software program further comprises a routine for requesting a row of data from said spreadsheet program.

13. An apparatus as set forth in claim 12 wherein said routine requests a row of data by submitting a command that is interpreted by said spreadsheet program.

14. The apparatus as set forth in claim 10 wherein said drawing program is VISIO®.

15. The apparatus as set forth in claim 10 wherein said interpreted commands are interpretable by said drawing program to generate said timing chart.

16. The apparatus as set forth in claim 10 wherein said apparatus comprises electronic signals within a computer memory.

17. The apparatus as set forth in claim 16 wherein said computer memory is a transportable disk.

18. The apparatus of claim 10, wherein said drawing program includes means for utilizing said interpreted commands and said captured data to accomplish at least one of providing a hard copy of said timing chart, and providing a visual display of said timing chart.

19. The apparatus of claim 10 further including means for saving said interpreted commands and said captured data to a plot file that can be used to generate said timing chart.

20. The apparatus of claim 10, and further including:
means for modifying at least one of said interpreted commands and said captured data; and
means for generating said timing chart from any modified interpreted commands and any modified captured data.

\* \* \* \* \*